(12) United States Patent
Ozawa

(10) Patent No.: US 7,861,194 B2
(45) Date of Patent: Dec. 28, 2010

(54) METHOD AND APPARATUS FOR CALCULATING WIRING CAPACITANCE, AND COMPUTER PRODUCT

(75) Inventor: Motohiro Ozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/033,299

(22) Filed: Jan. 12, 2005

(65) Prior Publication Data

US 2006/0043426 A1      Mar. 2, 2006

(30) Foreign Application Priority Data

Sep. 1, 2004   (JP) .............................. 2004-254576

(51) Int. Cl.
*G06F 17/50* (2006.01)
*G06F 9/45* (2006.01)

(52) U.S. Cl. .................................. 716/4; 716/5; 716/12

(58) Field of Classification Search ............. 716/12–15, 716/4–5, 10, 1
See application file for complete search history.

(56) References Cited

U.S. PATENT DOCUMENTS

| 6,185,722 | B1 | 2/2001 | Darden et al. | |
|---|---|---|---|---|
| 6,574,782 | B1 * | 6/2003 | Dewey et al. | 716/5 |
| 2004/0049751 | A1 * | 3/2004 | Teig et al. | 716/5 |
| 2004/0088664 | A1 * | 5/2004 | Srinivasan | 716/6 |
| 2004/0103384 | A1 * | 5/2004 | Tanaka | 716/8 |
| 2004/0216067 | A1 * | 10/2004 | Tanaka et al. | 716/10 |
| 2005/0097494 | A1 * | 5/2005 | Kitahara et al. | 716/11 |
| 2005/0183049 | A1 * | 8/2005 | Ohba et al. | 716/5 |
| 2005/0193354 | A1 * | 9/2005 | Ohba et al. | 716/5 |

FOREIGN PATENT DOCUMENTS

| JP | 2001-230323 | 8/2001 |
|---|---|---|
| JP | 2002-299456 | 10/2002 |
| JP | 2004-38395 | 2/2004 |

OTHER PUBLICATIONS

Peter Habitz et al., "IBM ASICs Redefine Performance Standard for Parasitic Extraction", *IBM Microelectronics*, vol. 7, No. 4, Fourth Quarter 2001.

Communication mailed from the Japanese Patent Office on Nov. 10, 2009 in the corresponding Japanese patent application No. 2004-254576.

Concise explanation of references AG (JP 2002-299456) and AH (JP 2004-38395) cited herein.

* cited by examiner

*Primary Examiner*—Sun J Lin
*Assistant Examiner*—Suresh Memula
(74) *Attorney, Agent, or Firm*—Staas & Halsey LLP

(57) ABSTRACT

A diagonal-capacitance calculating unit calculates diagonal capacitance based on the adjacent wirings in diagonally upward and downward direction from a target wiring. A basic-capacitance correcting unit corrects basic capacitance, which is wiring capacitance based on adjacent wirings in above, below, on a left of, and on a right of the target wiring, based on the adjacent wirings in diagonally upward and downward direction from the target wiring. A total-capacitance calculating unit adds up the diagonal capacitance calculated and the basic capacitance corrected, to calculate wiring capacitance of the target wiring.

19 Claims, 12 Drawing Sheets

FIG.2

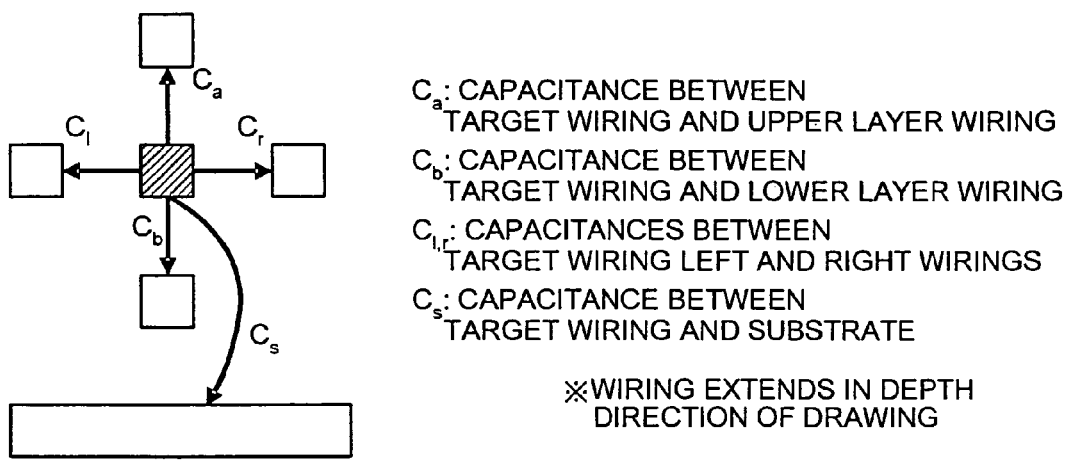

$C_a$: CAPACITANCE BETWEEN TARGET WIRING AND UPPER LAYER WIRING $C_b$: CAPACITANCE BETWEEN TARGET WIRING AND LOWER LAYER WIRING $C_{l,r}$: CAPACITANCES BETWEEN TARGET WIRING LEFT AND RIGHT WIRINGS $C_s$: CAPACITANCE BETWEEN TARGET WIRING AND SUBSTRATE

※WIRING EXTENDS IN DEPTH DIRECTION OF DRAWING

CAPACITANCE VALUE TABLE 1 : CAPACITANCE VALUE TABLE ($C_a$) OF CAPACITANCE BETWEEN TARGET WIRING AND UPPER LAYER WIRING

CAPACITANCE VALUE TABLE 2 : CAPACITANCE VALUE TABLE ($C_b$) OF CAPACITANCE BETWEEN TARGET WIRING AND LOWER LAYER WIRING

CAPACITANCE VALUE TABLE 3 : CAPACITANCE VALUE TABLE ($C_l+C_r+C_s$) OF CAPACITANCE BETWEEN TARGET WIRING AND UPPER LAYER WIRING

FIG.3

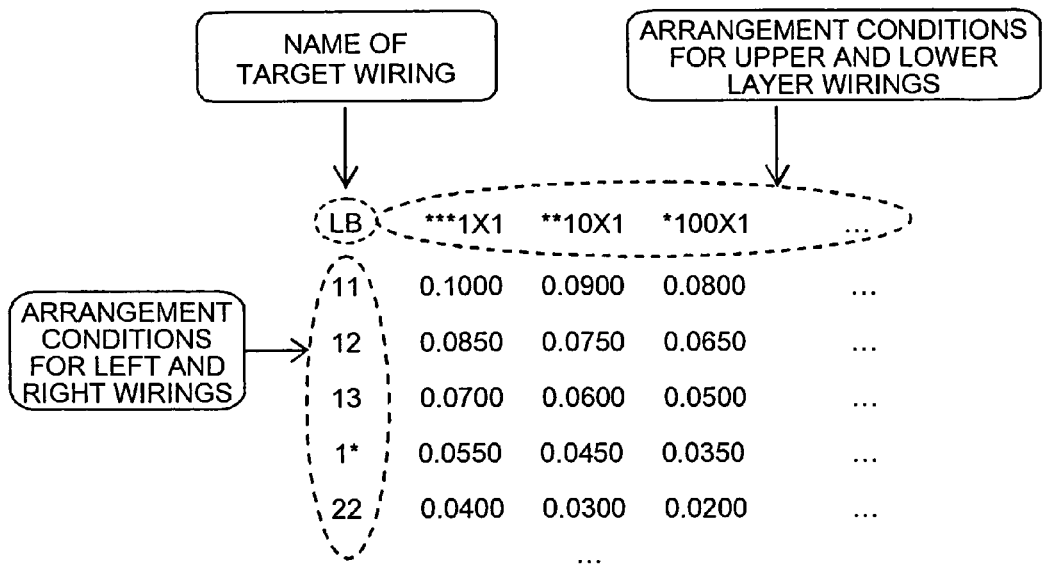

<ARRANGEMENT CONDITIONS FOR UPPER AND LOWER LAYER WIRINGS>
- RESPECTIVE CHARACTERS OF ***1X1 OR THE LIKE REPRESENT WIRING LAYERS, THAT IS, SIXTH LAYER TO FIRST LAYER FROM LEFT.
- *INDICATES THAT WIRING MAY OR MAY NOT BE PRESENT IN THE LAYER (THE LAYER CANNOT BE SEEN BECAUSE THERE IS WIRING IN LAYER CLOSER TO LAYER OF ATTENTION THAN THE LAYER).

- 1 INDICATES THAT WIRING IS PRESENT IN THE LAYER.
- 0 INDICATES THAT THERE IS NO WIRING IN THE LAYER.
- X INDICATES THAT THE LAYER IS TARGET WIRING LAYER

<ARRANGEMENT CONDITIONS FOR LEFT AND RIGHT ADJACENT WIRINGS>
- RESPECTIVE CHARACTERS OF 11 OR THE LIKE REPRESENTS ARRANGEMENT CONDITIONS FOR LEFT OR RIGHT. IF WIRING CONDITIONS ARE THE SAME WHEN LEFT AND RIGHT ARE INTERCHANGED, IT IS ASSUMED THAT WIRING CONDITIONS ARE IDENTICAL.
- 1 INDICATES THAT WIRING IS PRESENT IN ONE GRID FROM TARGET WIRING LAYER. THE SAME HOLDS TRUE FOR 2 AND 3.
- *INDICATES THAT NO WIRING IS PRESENT WITHIN THREE GRIDS FROM TARGET WIRING LAYER.

FIG.5

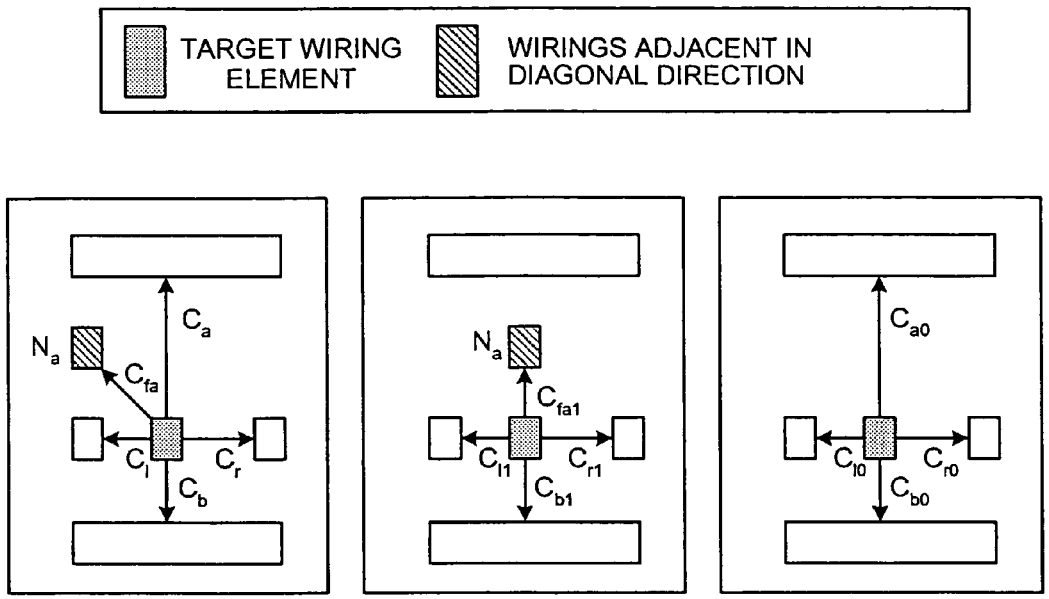

- FROM VIRTUAL MODEL 1
  $C_{f1}$ = CAPACITANCE VALUE TABLE 1
      = $C_{fa1}$
  $C_{g1}$ = CAPACITANCE VALUE TABLE 2 + CAPACITANCE VALUE TABLE 3
      = $C_{b1}+C_{l1}+C_{r1}+C_{s1}$

※IT IS ASSUMED THAT CAPACITANCE BETWEEN TARGET WIRING ELEMENT AND UPPER WIRING IS NOT SEEN DUE TO $N_a$ IN LOWER MODEL 1 ($C_{a1}$=0).

- FROM VIRTUAL MODEL 2
  $C_{t0}$ = CAPACITANCE VALUE TABLE 1 + CAPACITANCE VALUE TABLE 2 + CAPACITANCE VALUE TABLE 3
      = $C_{a0}+C_{b0}+C_{l0}+C_{r0}+C_{s0}$

WIRING CAPACITANCE BETWEEN TARGET WIRING AND WIRING DIAGONALLY ABOVE THE TARGET WIRING

WIRING CAPACITANCE AT THE TIME WHEN IT IS ASSUMED THAT WIRING DIAGONALLY ABOVE THE TARGET WIRING IS RIGHT ABOVE THE TARGET WIRING

NO UPPER
LAYER WIRING

UPPER LAYER WIRING IS
DIAGONALLY ABOVE
THE TARGET WIRING

UPPER LAYER WIRING IS
RIGHT ABOVE
THE TARGET WIRING

METHOD AND APPARATUS FOR CALCULATING WIRING CAPACITANCE, AND COMPUTER PRODUCT

BACKGROUND OF THE INVENTION

1) Field of the Invention

The present invention relates to a technology for calculating a wiring capacitance efficiently without loosing accuracy by reducing a size of a capacitance value table.

2) Description of the Related Art

When designing a large-scale-integration (LSI), a speed of a signal propagating through a transistor and a wiring is calculated to confirm that the LSI operates at an estimated speed. The wiring is represented by a model of resistance and capacitance, and a resistance value depends only on a shape of the wiring targeted for calculation of signal propagation time (hereinafter, "a target wiring"). However, a capacitance value depends on a state of arrangement of wirings above, below, on the left of, and on the right of the target wiring and in diagonally upward and downward directions from the target wiring (hereinafter, "an adjacent wiring") including the target wiring.

Therefore, conventionally, capacitance values based on arrangement patterns of the adjacent wirings above, below, on the left of, and on the right of the target wiring and in the diagonally upward and downward directions from the target wiring are stored as a capacitance value table, and a wiring capacitance conforming to a wiring pattern in the capacitance value table is used as a capacitance value of the target wiring based on arrangement information of the adjacent wirings (see, for example, U.S. Pat. No. 6,185,722 and Habitz, Bill Livingstone, Laura Darden, Paul Zuchowski "IBM ASICs Redefine Performance Standard for Parasitic Extraction", IBM Microelectronics, Vol. 7, No. 4).

However, since there are an enormous number of wiring patterns of adjacent wirings that affect a capacitance value of a target wiring, there is a problem in that it takes time to create a capacitance value table and a size of the capacitance value table to be created increases. It is anticipated that, in future, the size of the capacitance value table further increases when the number of wiring layers increases to create an LSI of higher performance.

Although, it is possible to reduce the number of wiring patterns and the size of the capacitance value table by neglecting patterns of adjacent wirings arranged in the diagonally upward and downward directions from the target wiring, this results in a degradation of accuracy in calculation of the wiring capacitance.

SUMMARY OF THE INVENTION

It is an object of the present invention to solve at least the above problems in the conventional technology.

An apparatus for calculating wiring capacitance of a target wiring based on first adjacent wirings and second adjacent wirings, according to one aspect of the present invention, includes a diagonal-capacitance calculating unit that calculates diagonal capacitance based on the second adjacent wirings; a basic-capacitance correcting unit that corrects basic capacitance based on the second adjacent wirings; and a total-capacitance calculating unit that adds up the diagonal capacitance calculated and the basic capacitance corrected, to calculate the wiring capacitance. The first adjacent wirings are adjacent wirings in above, below, on a left of, and on a right of the target wiring. The second adjacent wirings are adjacent wirings in diagonally upward and downward direction from the target wiring. The diagonal capacitance is wiring capacitance based on the second adjacent wirings. The basic capacitance is wiring capacitance based on the first adjacent wirings.

A method of calculating wiring capacitance of a target wiring based on first adjacent wirings and second adjacent wirings, according to another aspect of the present invention, includes calculating diagonal capacitance based on the second adjacent wirings; correcting basic capacitance based on the second adjacent wirings; and adding up the diagonal capacitance calculated and the basic capacitance corrected, to calculate the wiring capacitance. The first adjacent wirings are adjacent wirings in above, below, on a left of, and on a right of the target wiring. The second adjacent wirings are adjacent wirings in diagonally upward and downward direction from the target wiring. The diagonal capacitance is wiring capacitance based on the second adjacent wirings. The basic capacitance is wiring capacitance based on the first adjacent wirings.

A computer-readable recording medium according to still another aspect of the present invention stores a computer program that makes a computer execute the above method according to the present invention.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a schematic diagram for illustrating a capacitance value table;

FIG. 3 is a schematic diagram of an example of the capacitance value table;

FIG. 5 is a schematic diagram for illustrating a relation between another example of arrangement of the virtual model and a value of the capacitance value table;

DETAILED DESCRIPTION

Exemplary embodiments of a method and an apparatus for calculating wiring capacitance, and a computer product according to the present invention will be explained in detail with reference to the accompanying drawings. According to an embodiment of the present invention, when a capacitance value of a target wiring is calculated, the target wiring is sectioned into wiring elements of a unit length determined appropriately (hereinafter, "wiring elements"), and arrangement conditions for adjacent wirings are checked for the respective wiring elements to calculate a capacitance value. Then, a final capacitance of the target wiring is calculated by adding up capacitance values of the wiring elements or combining the wiring elements as a circuit.

Figure 1:
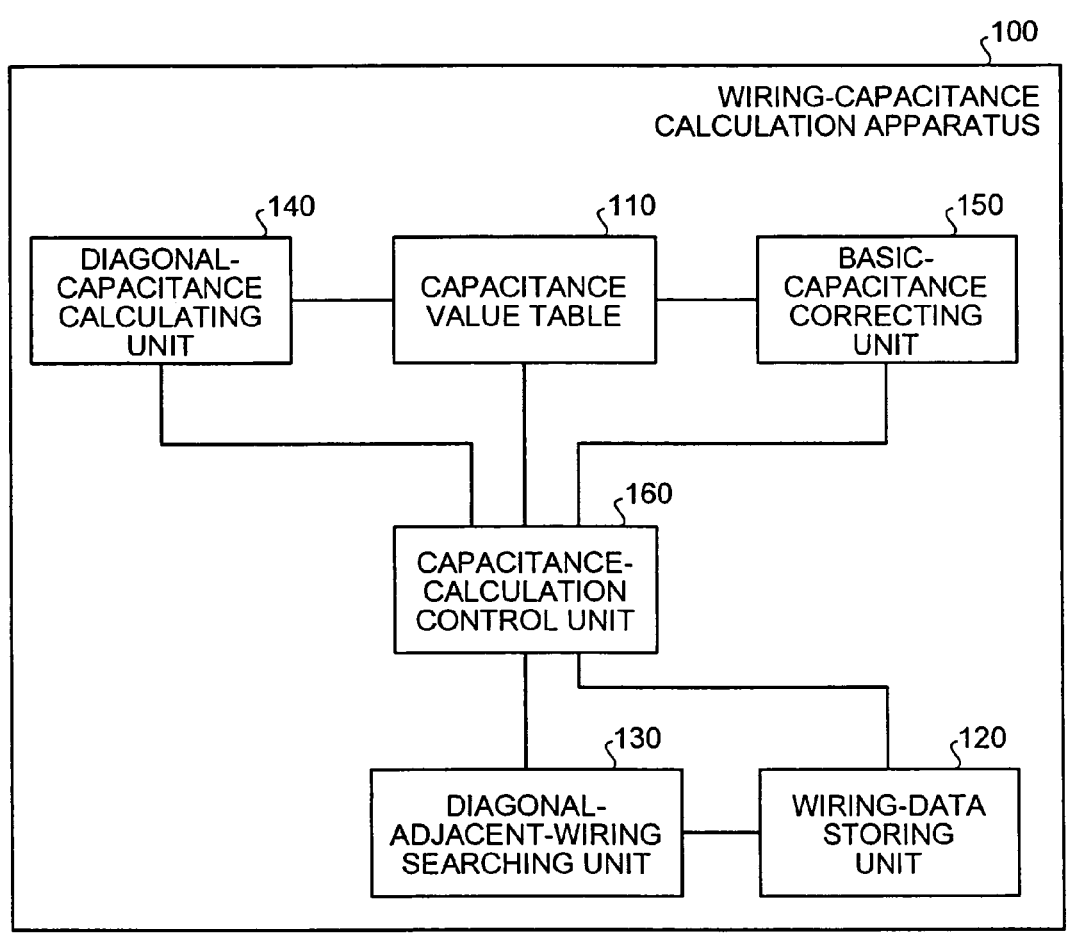
FIG. 1 is a block diagram of a structure of a wiring-capacitance calculating apparatus according to an embodiment of the present invention.

FIG. 1 is a block diagram of a structure of the wiring-capacitance calculating apparatus according to the present embodiment. A wiring-capacitance calculating apparatus 100 includes a capacitance value table 110, a wiring-data storing unit 120, a diagonally-adjacent-wiring searching unit 130, a diagonal-capacitance calculating unit 140, a basic-capacitance correcting unit 150, and a capacitance-calculation control unit 160.

The capacitance value table 110 is a table storing wiring capacitances based on arrangement patterns of adjacent wirings. However, this capacitance value table 110 stores only wiring capacitances with respect to combined patterns of adjacent wirings above, below, on the left of, and on the right of a target wiring and does not store wiring capacitances with respect to combined patterns of adjacent wirings diagonally above and diagonally below the target wiring.

Since this capacitance value table 110 stores only wiring capacitances with respect to combined patterns of adjacent wirings above, below, on the left of, and on the right of a target wiring and does not store wiring capacitances with respect to combined patterns of adjacent wirings diagonally above and diagonally below the target wiring, it is possible to reduce a size of the capacitance value table 110 and create the capacitance value table 110 efficiently.

FIG. 2 is a schematic diagram for illustrating the capacitance value table 110. The capacitance value table 110 includes three capacitance value tables, namely, a "capacitance value table 1", a "capacitance value table 2", and a "capacitance value table 3".

The "capacitance value table 1" stores a wiring capacitance $C_a$ between a target wiring and an upper layer wiring, the "capacitance value table 2" stores a wiring capacitance $C_b$ between the target wiring and a lower layer wiring, and the "capacitance value table 3" stores a sum of a wiring capacitance $C_l$ between the target wiring and a left wiring, a wiring capacitance $C_r$ between the target wiring and a right wiring, and a wiring capacitance $C_s$ between the target wiring and a substrate.

FIG. 3 is a schematic diagram of an example of the capacitance value table. The "capacitance value table 1", the "capacitance value table 2", and the "capacitance value table 3" are in the same format, and the "capacitance value table 1" will be described as an example.

As shown in FIG. 3, as arrangement patterns of adjacent wirings, there are combinations of arrangement conditions for upper and lower layer wirings and arrangement conditions for left and right wirings. Here, in a character string like "***1×1" forming the arrangement conditions for the upper and lower layer wirings, respective characters represent wiring states of respective wiring layers, that is, a sixth layer, a fifth layer, . . . , a first layer in order from the left. It is assumed that there are six wiring layers.

The character "*" indicates that a wiring may or may not be present in the layer (the layer cannot be seen because there is a wiring in a layer closer to a target layer than the layer), "1" indicates that a wiring is present in the layer, "0" indicates that there is no wiring in the layer, and "X" indicates that the layer is a target wiring layer.

In addition, the two numerals forming the wiring conditions for the left and the right wirings represent arrangement conditions for the left or the right, respectively. If the wiring conditions are the same when the left and the right are interchanged, it is assumed that the wiring conditions are identical. The numeral "1" indicates that a wiring is present in one grid from the wiring target layer, the numeral "2" indicates that a wiring is present in two grids from the wiring target layer, and the numeral "3" indicates that a wiring is present in three grids from the wiring target layer. "*" indicates that no wiring is present within three grids from the wiring target layer. Note that, here, it is assumed that, when an adjacent wiring is in a position farther than three grids, the adjacent wiring hardly affects a capacitance value.

In this way, the wiring capacitance $C_a$ between the target wiring and the upper layer wiring is affected by states of other adjacent wirings and takes a value that varies depending on the states of the other adjacent wirings. The other wiring capacitances $C_b$, $C_l$, $C_r$, and $C_s$ are affected by the states of the other adjacent wirings in the same manner.

The wiring-data storing unit 120 is a storing unit that stores data concerning a wiring state of an LSI. It is possible to specify a pattern of an adjacent wiring with respect to a target wiring based on the data stored in this wiring-data storing unit 120.

The diagonally-adjacent-wiring searching unit 130 is a processing unit that searches data concerning the wiring state stored in the wiring-data storing unit 120 and judges whether there is an adjacent wiring in a diagonally upward direction or a diagonally downward direction from the target wiring.

The diagonal-capacitance calculating unit 140 is a processing unit that, when the diagonally-adjacent-wiring searching unit 130 judges that there is an adjacent wiring in the diagonally upward direction or the diagonally downward direction from the target wiring, calculates a diagonal capacitance that is a wiring capacitance with respect to the adjacent wiring in the diagonally upward direction or the diagonally downward direction.

The basic-capacitance correcting unit 150 is a processing unit that corrects a basic capacitance, which is a wiring capacitance based on adjacent wirings above, below, on the left of, and on the right of a target wiring and a substrate, taking into account an influence due to diagonal capacitance.

The capacitance-calculation control unit 160 is a processing unit that performs control for the entire wiring-capacitance calculating apparatus 100. The capacitance-calculation control unit 160 calculates wiring capacitances of respective wiring elements using the diagonal-capacitance calculating unit 140 and the basic-capacitance correcting unit 150. In addition, this capacitance-calculation control unit 160 adds up capacitance values of the wiring elements to calculate a wiring capacitance of the target wiring.

Figure 4:
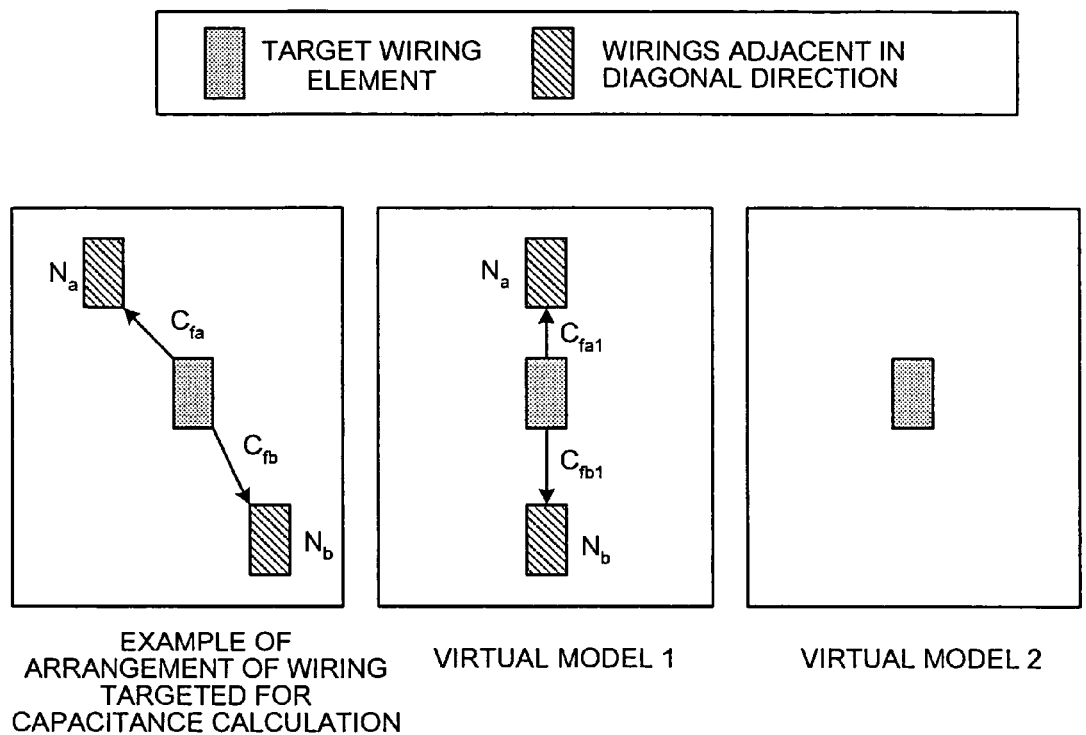
FIG. 4 is a schematic diagram of a virtual model that a diagonal-capacitance calculating unit uses for calculating a diagonal capacitance.

FIG. 4 is a schematic diagram of a virtual model that a diagonal-capacitance calculating unit 140 uses for calculating a diagonal capacitance. $N_a$ and $N_b$ indicate adjacent wirings located diagonally above and diagonally below a target wiring element, respectively, and $C_{fa}$ and $C_{fb}$ indicate wiring capacitances between the target wiring element and $N_a$ and $N_b$, respectively. In addition, it is assumed that a diagonal capacitance $C_f = C_{fa} + C_{fb}$, and, when a total wiring capacitance of the target wiring element is $C_t$, $C_t = C_f + C_g$.

Here, $C_g$ is a wiring capacitance obtained by deducting the diagonal capacitance from the total wiring capacitance of the target wiring element and is a basic capacitance based on adjacent wirings other than an adjacent wiring in a diagonal direction and a substrate. This basic capacitance $C_g$ has different values when there is an adjacent wiring in the diagonal direction and when there is no adjacent wiring in the diagonal direction. In other words, when there is an adjacent wiring in the diagonal direction, since this basic capacitance $C_g$ has a small value due to an influence of the adjacent wiring, it is necessary to correct the value.

A "virtual model 1" is a model at the time when it is assumed that $N_a$ and $N_b$ are located right above and right below a target wiring element, respectively. In this case, it is assumed that wiring capacitances between the target wiring element and $N_a$ and $N_b$ are $C_{fa1}$ and $C_{fb1}$, respectively, and a total wiring capacitance of the target wiring element is $C_{t1}$. In addition, it is assumed that $C_{f1} = C_{fa1} + C_{fb1}$ and $C_{g1} = C_{t1} - C_{f1}$.

A "virtual model 2" is a model at the time when it is assumed that $N_a$ and $N_b$ are not present. In this case, when it is assumed that a total wiring capacitance of a target wiring element is $C_{t0} = C_{f0} + C_{g0}$, $C_{f0} = 0$ and $C_{t0} = C_{g0}$.

FIG. 5 is a schematic diagram for illustrating a relation between another example of arrangement of the virtual model and a value of the capacitance value table. In this example of arrangement, it is assumed that wiring capacitances based on an adjacent wiring $N_a$ diagonally above a target wiring element and adjacent wirings above, below, on the left of, and on the right of the target wiring element are $C_{fa}$, $C_a$, $C_b$, $C_l$, and $C_r$, respectively, the wiring capacitances in the "virtual model 1" are $C_{fa1}$, $C_{b1}$, $C_{l1}$, and $C_{r1}$, respectively, and the wiring capacitances in the "virtual model 2" are $C_{a0}$, $C_{b0}$, $C_{l0}$, and $C_{r0}$, respectively. Note that, in the "virtual model 1", since a capacitance between an upper layer wiring and the target wiring element is invisible due to $N_a$, it is assumed that $C_{a1} = 0$.

In this case, from the "virtual model 1", $C_{f1}$ = a value of the "capacitance value table 1" = $C_{fa1}$
$C_{g1}$ = values of the "capacitance value table 2" + values of the "capacitance value table 3" = $C_{b1} + C_{l1} + C_{r1} + C_{s1}$ and from the "virtual model 2",
$C_{t0}$ = the capacitance value table 1 + the capacitance value table 2 + the capacitance value table 3 = $C_{a0} + C_{b0} + C_{l0} + C_{r0} + C_{s0}$.

Figure 6:
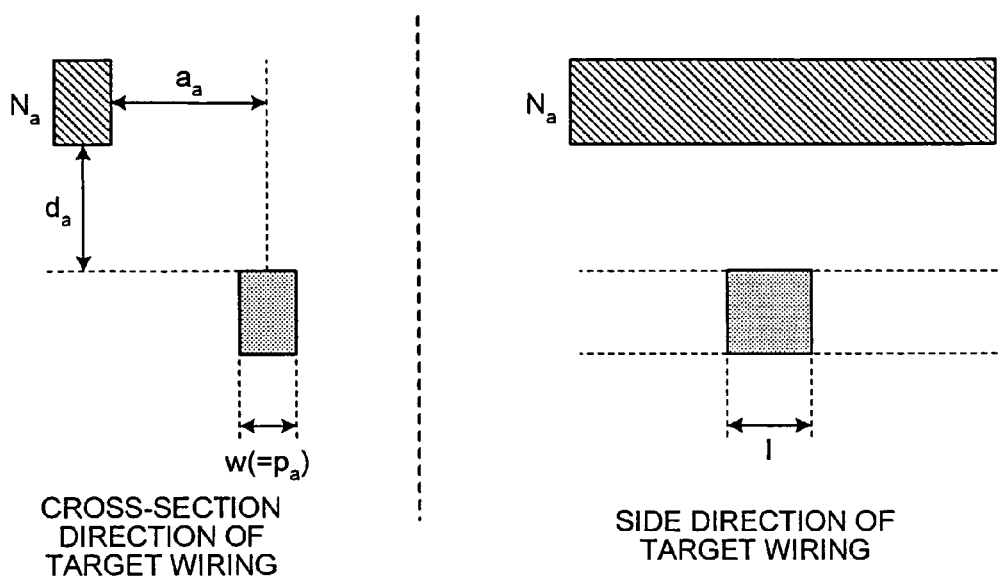
FIG. 6 is a schematic diagram for illustrating a coefficient used for $C_{fa}$ calculation (when $N_a$ is parallel to a target wiring)
Figure 7:
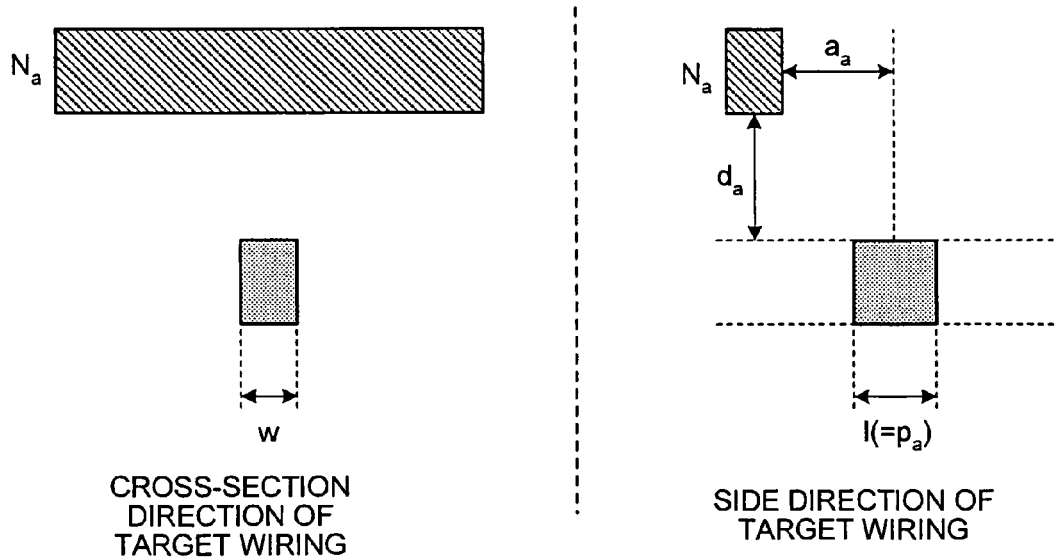
FIG. 7 is a schematic diagram for illustrating a coefficient used or $C_{fa}$ calculation (when $N_a$ is in a position of twist with respect to a target wiring)
Figure 8:
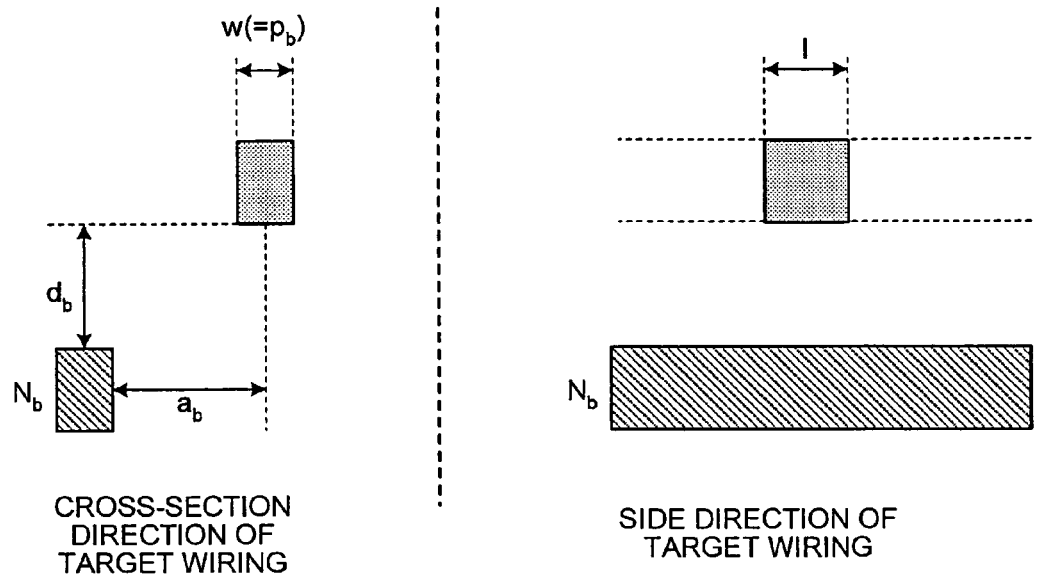
FIG. 8 is a schematic diagram for illustrating a coefficient used for $C_{fb}$ calculation (when $N_b$ is parallel to a target wiring)
Figure 9:
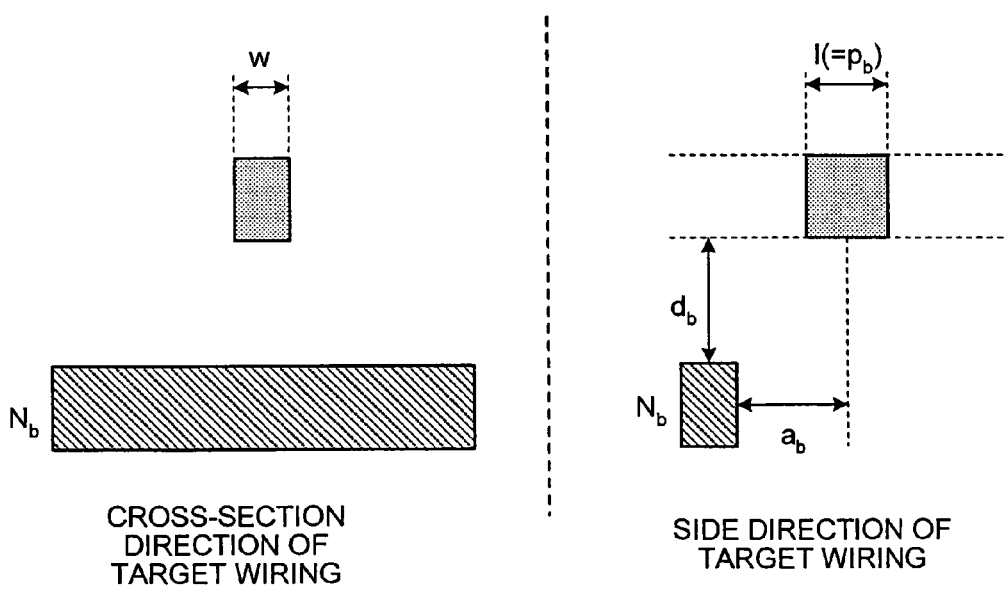
FIG. 9 is a schematic diagram for illustrating a coefficient used for $C_{fb}$ calculation (when $N_b$ is in a position of twist with respect to a target wiring)

In addition, FIGS. 6 and 7 are diagrams of coefficients used for $C_{fa}$ calculation. Here, FIG. 6 shows a case in which $N_a$ is parallel to a target wiring, and FIG. 7 shows a case in which $N_a$ is in a position of twist with respect to the target wiring. FIGS. 8 and 9 are diagrams of coefficients used for $C_{fb}$ calculation. Here, FIG. 8 shows a case in which $N_b$ is parallel to a target wiring, and FIG. 9 shows a case in which $N_b$ is in a position of twist with respect to the target wiring. In FIGS. 6 to 9, definitions of the respective coefficients are as described below.

w: width of a target wiring element
l: length of the target wiring element
$a_a$: horizontal direction component of a distance between an end of $N_a$ and a center of the target wiring element
$d_a$: vertical direction component of a distance between $N_a$ and the target wiring element
$p_a$: $p_a = w$ when $N_a$ is parallel to the target wiring, $p_a = l$ when $N_a$ is parallel to the target wiring
$a_b$: horizontal direction component of a distance between an end of $N_b$ and a center of the target wiring element
$d_b$: a vertical direction component of a distance between $N_b$ and the target wiring element
$p_b$: $p_b = w$ when $N_b$ is parallel to the target wiring, $p_b = l$ when $N_b$ is in parallel to the target wiring When it is assumed that $$g(a, d, p) \equiv \frac{d\sqrt{a^2 + d^2}}{pa} \ln\left(1 + \frac{pa}{a^2 + d^2 - \frac{pa}{2}}\right) \quad (1)$$

using the above coefficients, $C_{fa}$, $C_{fb}$, and, $C_f$ become $C_{fa} = C_{fa1} \cdot g(a_a, d_a, p_a)$
$C_{fb} = C_{fb1} \cdot g(a_b, d_b, p_b)$
$C_f = C_{fa} + C_{fb}$ where $C_{fa1}$ and $C_{fb1}$ are calculated from the capacitance value table.

Figure 10:
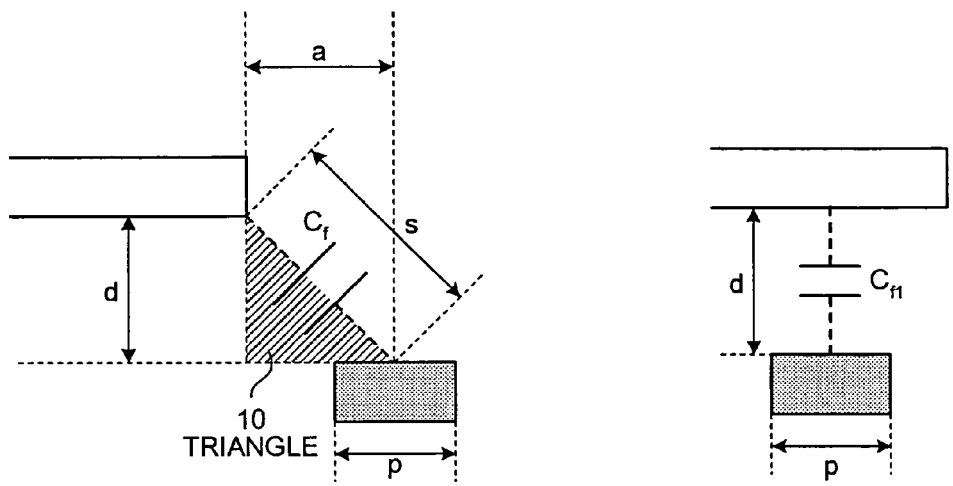
FIG. 10 is a schematic diagram for illustrating a wiring capacitance with respect to a diagonally upward wiring and a wiring capacitance at the time when it is assumed that the diagonally upward wiring is right above a target wiring.
Figure 11:
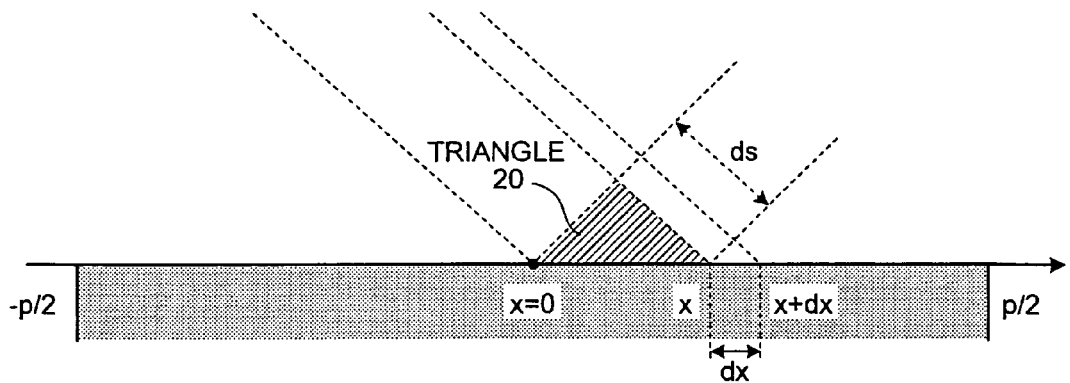
FIG. 11 is a schematic diagram for illustrating a relation between a position and a size at the time of wiring capacitance calculation.

G(a, d, p) can be derived as described below. As shown in FIG. 10, assuming that a wiring capacitance between a target wiring and a wiring diagonally above the target wiring is $C_f$ and a wiring capacitance at the time when the wiring diagonally above the target wiring is right above the target wiring is $C_{f1}$, an x axis is set along an upper surface of the wiring as shown in FIG. 11.

Here, it is assumed that a distance between the target wiring and the upper layer wiring is sufficiently long (s>>x) and the target wiring can have a capacitance with respect to a lower corner of a wiring in a diagonally upward direction from the target wiring. In addition, it is assumed that a wiring drawn from a position of x=0 to a lower corner of the upper layer wiring and a line drawn from a position of x=x to the lower corner of the upper layer wiring can be regarded as parallel.

From the above assumption, a distance from the position of x=x to the lower corner of the upper layer wiring is calculated as follows from similarity of a triangle 10 in FIG. 10 and a triangle 20 in FIG. 20.

$$a : ds = s : x \quad (2)$$
$$\therefore ds = \frac{a}{s}x$$

Thus, a parallel plate capacitance $dC_f$ in a micro element in the position of x=x is calculated as follows assuming that a depth of FIG. 10 is w.

$$dC_f = \frac{\varepsilon w dx}{s + ds} = \frac{\varepsilon w}{s + \frac{a}{s}x} dx \quad (3)$$

Thus, a capacitance $C_f$ between the target wiring and the wiring in the diagonally upward direction from the target wiring is calculated as follows by integrating $dC_f$ from x=−p/2 to x=p/2.

$$C_f = \int dC \qquad (4)$$

$$= \int_{-\frac{p}{2}}^{\frac{p}{2}} \frac{\varepsilon w}{s + \frac{a}{s}x} dx$$

$$= \left[\frac{\varepsilon w s}{a} \ln\left|s + \frac{a}{s}x\right|\right]_{-\frac{p}{2}}^{\frac{p}{2}}$$

$$= \frac{\varepsilon w s}{a} \ln\left|1 + \frac{pa}{s^2 - \frac{pa}{2}}\right|$$

Here, since a wiring capacitance $C_{f1}$ at the time when it is assumed that the wiring diagonally above the target wiring comes to right above the target wiring is $C_{f1}=\varepsilon wp/d$, from this expression and $$s = \sqrt{a^2 + d^2} \qquad (5)$$

$C_f$ is calculated as follows.

$$C_f = C_{f1} \frac{d\sqrt{a^2+d^2}}{pa} \ln\left|1 + \frac{pa}{a^2+d^2 - \frac{pa}{2}}\right| \qquad (6)$$

Note that, since d, p, and a are values for which domains are determined in LSI design, it is also possible that calculation values of a function g are provided as a table with d, p, and a as variables for speedup of calculation, and a value is calculated by interpolation in a combination in which d, p, and a do not fulfill the table. An example of the table of the function g is indicated below.

<Example of Contents of the Table of the Function g>
 Wiring target layer (value of p)
 [Wiring layer of $N_a$ or $N_b$]
 (value of a, value of g) (value of a, value of g) . . .
 [Wiring layer of $N_a$ or $N_b$)]
 . . .

Example of Numerical Values of the Table of the Function g>
 LD(900)
 [LA]
 (900, 950) (1800, 900) (2700 850) (3600, 800) (4500, 750) (5400, 700)
 [LB]
 . . .

Note that, in the example of the table, a value of d is not clearly indicated because the value depends on a wiring layer.

Figure 12:
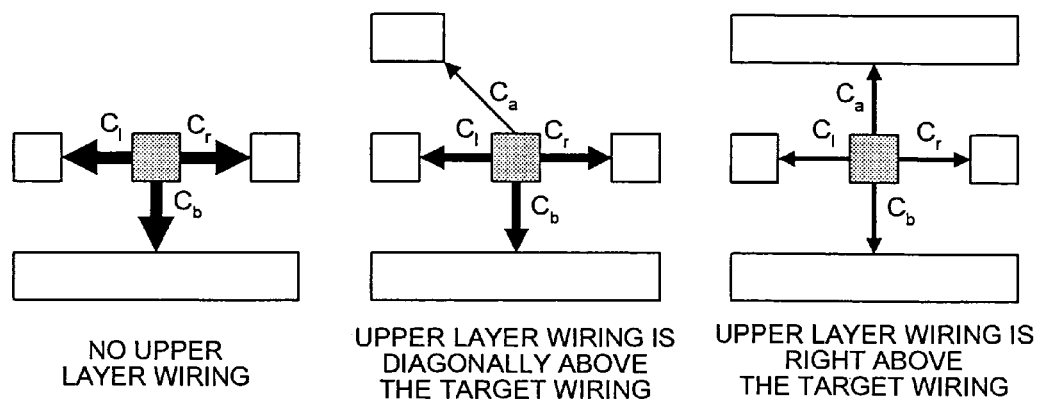
FIG. 12 is a schematic diagram for illustrating an influence of a position of an upper layer wiring on other wiring capacitances.

FIG. 12 is a schematic diagram for illustrating an influence of a position of an upper layer wiring on other wiring capacitances. When an upper layer for a target wiring varies as shown in FIG. 12, a wiring capacitance $C_a$ of the upper layer wiring changes naturally, and values of $C_l$, $C_r$, and $C_b$ also change due to an influence of $C_a$.

In general, when $C_a$ increases, $C_l$, $C_r$, and $C_b$ decrease. When $C_f = C_a$ and $C_g = C_l + C_r + C_b$ in FIG. 12, it is seen by actually extracting a capacitance that $C_f$ and $C_g$ are in a relation of the next expression.

$$C_g = \frac{\beta}{C_f + \alpha} + \gamma \qquad (7)$$

where $\alpha$, $\beta$, and $\gamma$ are constants.

When it is assumed that $C_g=C_{g0}$ and $C_f=0$ in a state in which there is no upper layer wiring and $C_g=C_{g1}$ and $C_f=C_{f1}$ in a state in which an upper layer wiring is right above the target wiring, $$\left.\begin{array}{l} C_{t0} = C_{g0} = \dfrac{\beta}{C_{f0}+\alpha} + \gamma = \dfrac{\beta}{\alpha} + \gamma \\[6pt] C_{g1} = \dfrac{\beta}{C_{f1}+\alpha} + \gamma \end{array}\right\} \qquad (8)$$

and a total wiring capacitance $C_t=C_f+C_g$ should hardly change in an initial stage when $C_f$ increases from the state in which there is no upper layer wiring, the following expression is derived.

$$\frac{dC_t}{dC_f}\bigg|_{C_f=0} = 1 + \frac{dC_g}{dC_f}\bigg|_{C_f=0} = 1 - \frac{\beta}{\alpha^2} = 0 \qquad (9)$$

Thus, the three expression of (8) and (9) are solved simultaneously as follows.

$$\left.\begin{array}{l} \alpha = \dfrac{C_{f1}(C_{g1}-C_{t0})}{-C_{f1}+C_{t0}-C_{g1}} \\[6pt] \beta = \dfrac{C_{f1}^2(C_{g1}-C_{t0})^2}{(-C_{f1}+C_{t0}-C_{g1})^2} \\[6pt] \gamma = \dfrac{C_{t0}(C_{t0}-C_{g1})-C_{f1}C_{g1}}{-C_{f1}+C_{t0}-C_{g1}} \end{array}\right\} \qquad (10)$$

Therefore, it is possible to calculate $\alpha$, $\beta$, and $\gamma$ from the values of $C_{t0}(C_{g0})$, $C_{f1}$, and $C_{g1}$ using the expression (10) and calculate a correction value $C_g$ from the values of $\alpha$, $\beta$, $\gamma$, and $C_f$ using the expression (7).

Figure 13:
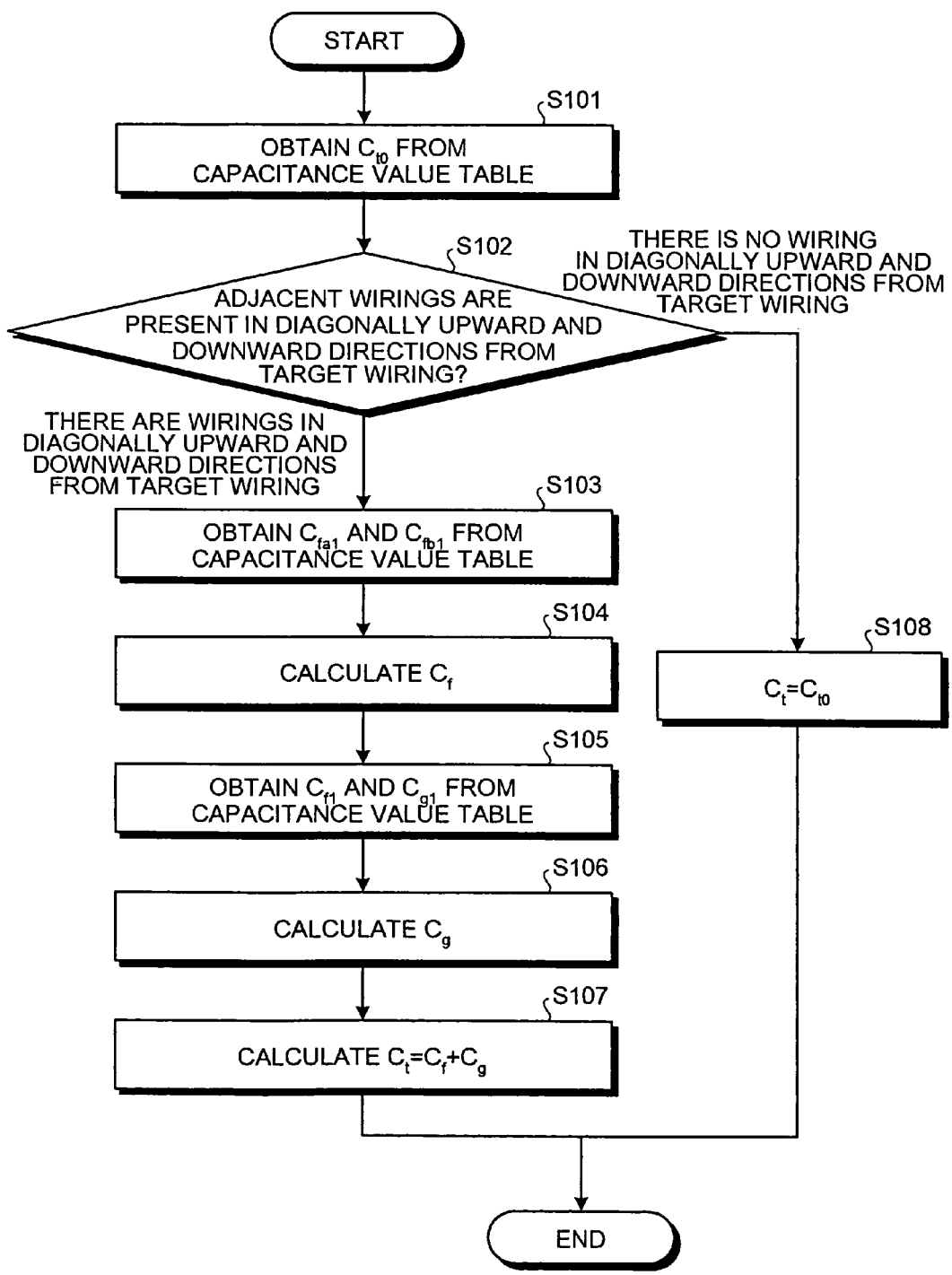
FIG. 13 is a flowchart of a process procedure for calculating wiring-capacitance for a target wiring element by the wiring-capacitance calculating apparatus according to the present embodiment.

FIG. 13 is a flowchart of a process procedure for calculating wiring-capacitance for a target wiring element by the wiring-capacitance calculating apparatus 100 according to the present embodiment.

As shown in the figure, in the wiring-capacitance calculating apparatus 100, the capacitance-calculation control unit 160 obtains a basic capacitance $C_{t0}$ from a capacitance value table 110 (step S101). Then, the diagonally-adjacent-wiring searching unit 130 searches adjacent wirings in diagonally upward and downward directions from the target wiring element and judges whether there are adjacent wirings in the diagonally upward and downward directions (step S102).

As a result, if there are adjacent wirings in the diagonally upward and downward directions, the diagonal-capacitance calculating unit 140 obtains $C_{fa1}$ and $C_{fb1}$ from the capacitance value table 110 based on the "virtual model 1" (step s103) and calculates a diagonal capacitance $C_f$ (step S104). When there are plural $N_a$ and $N_b$, the diagonal-capacitance calculating unit 140 obtains $C_{fa1}$ and $C_{fb1}$ for all $N_a$ and $N_b$ and calculates $C_f$.

Then, the basic-capacitance correcting unit 150 obtains $C_{f1}$ and $C_{g1}$ from the capacitance value table 110 (step S105) and calculates a correction value $C_g$ of a basic capacitance using $C_{f1}$, $C_{g1}$, and $C_{t0}$ (step S106). Then, the capacitance-calculation control unit 160 calculates a total wiring capacitance $C_t$ for the target wiring element using $C_f$ and $C_g$ (step S107).

On the other hand, if there is no adjacent wiring in the diagonally upward and downward directions, the capacitance-calculation control unit 160 sets the basic capacitance $C_{t0}$ as the total wiring capacitance $C_t$ for the target wiring element (step S108).

As described above, according to the present embodiment, wiring capacitances based on adjacent wirings above, below, on the left of, and on the right of the target wiring element and a substrate are stored in the capacitance value table 110, the diagonally-adjacent-wiring searching unit 130 judges whether there are adjacent wirings in the diagonally upward and downward directions from the target wiring element, if there are adjacent wirings in the diagonally upward and downward directions, the diagonal-capacitance calculating unit 140 calculates the diagonal capacitance $C_f$, the basic-capacitance correcting unit 150 calculates the correction value $C_g$ of the basic capacitance, and the capacitance-calculation control unit 160 adds up the diagonal capacitance $C_f$ and the correction value $C_g$ to calculate the total wiring capacitance $C_t$ of the target wiring element. Thus, it is possible to calculate a wiring capacitance accurately without storing a capacitance value for a combination of arrangement patterns in diagonal directions in the capacitance value table 110.

Note that, although the wiring-capacitance calculating apparatus is explained according to the present embodiment, it is possible to obtain a wiring-capacitance calculating program having the same function as the wiring-capacitance calculating apparatus by realizing a constitution of the wiring-capacitance calculating apparatus with software. Thus, a computer system, which executes this wiring-capacitance calculating program, will be explained.

Figure 14:
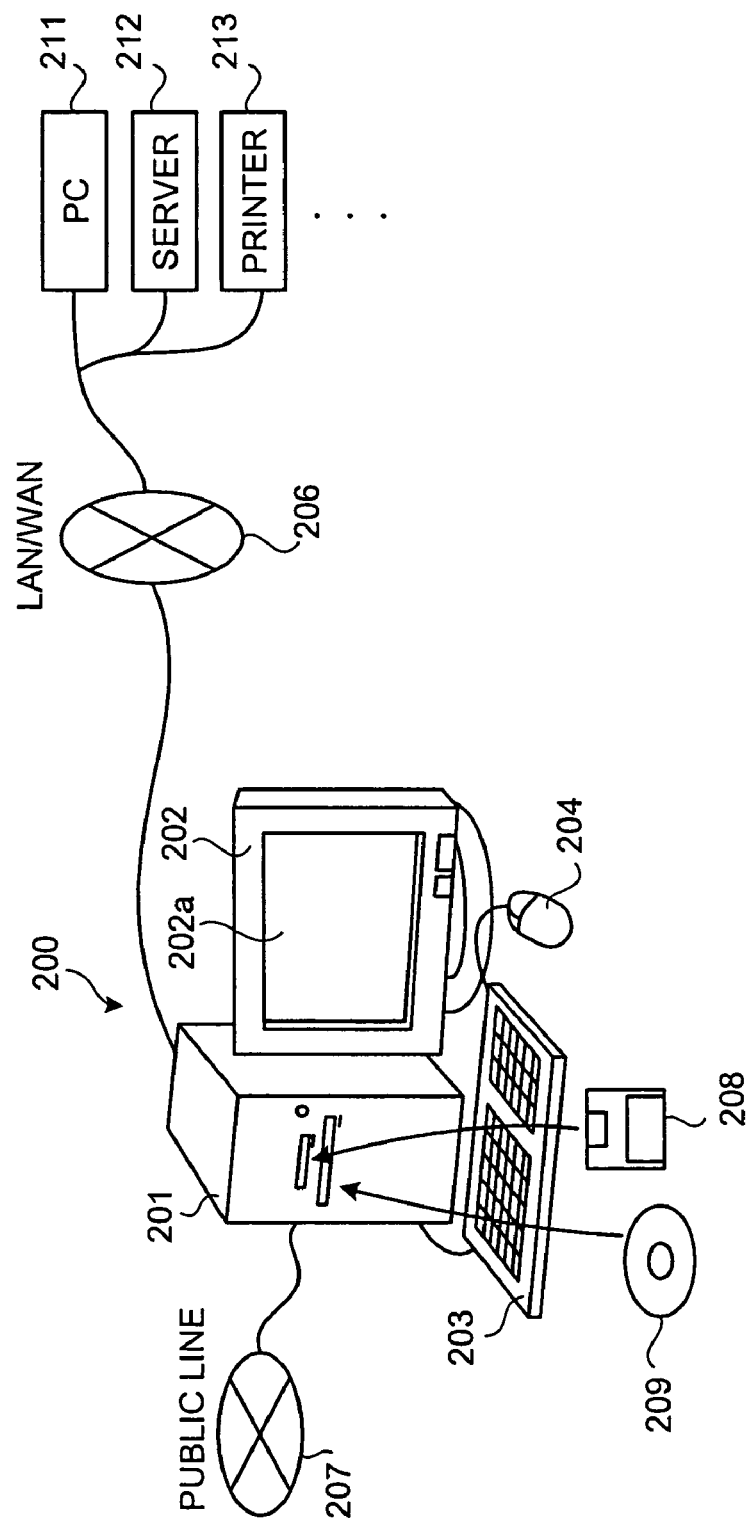
FIG. 14 is a schematic diagram of a computer system that executes a wiring-capacitance calculating program according to the present embodiment.

FIG. 14 is a schematic diagram of a computer system that executes a wiring-capacitance calculating program according to the present embodiment. As shown in the figure, this computer system 200 includes a main unit 201, a display 202 that displays information on a display screen 202a according to an instruction from the main unit 201, a keyboard 203 for inputting various kinds of information to this computer system 200, a mouse 204 that designates an arbitrary position on the display screen 202a of the display 202, a local area network (LAN) interface that connects the computer system 200 to a LAN 206 or a wide area network (WAN), and a modem that connects the computer system 200 to a public line 207. Here, the LAN 206 connects the computer system 200 with another computer system (PC) 211, a server 212, a printer 213, and the like.

Figure 15:
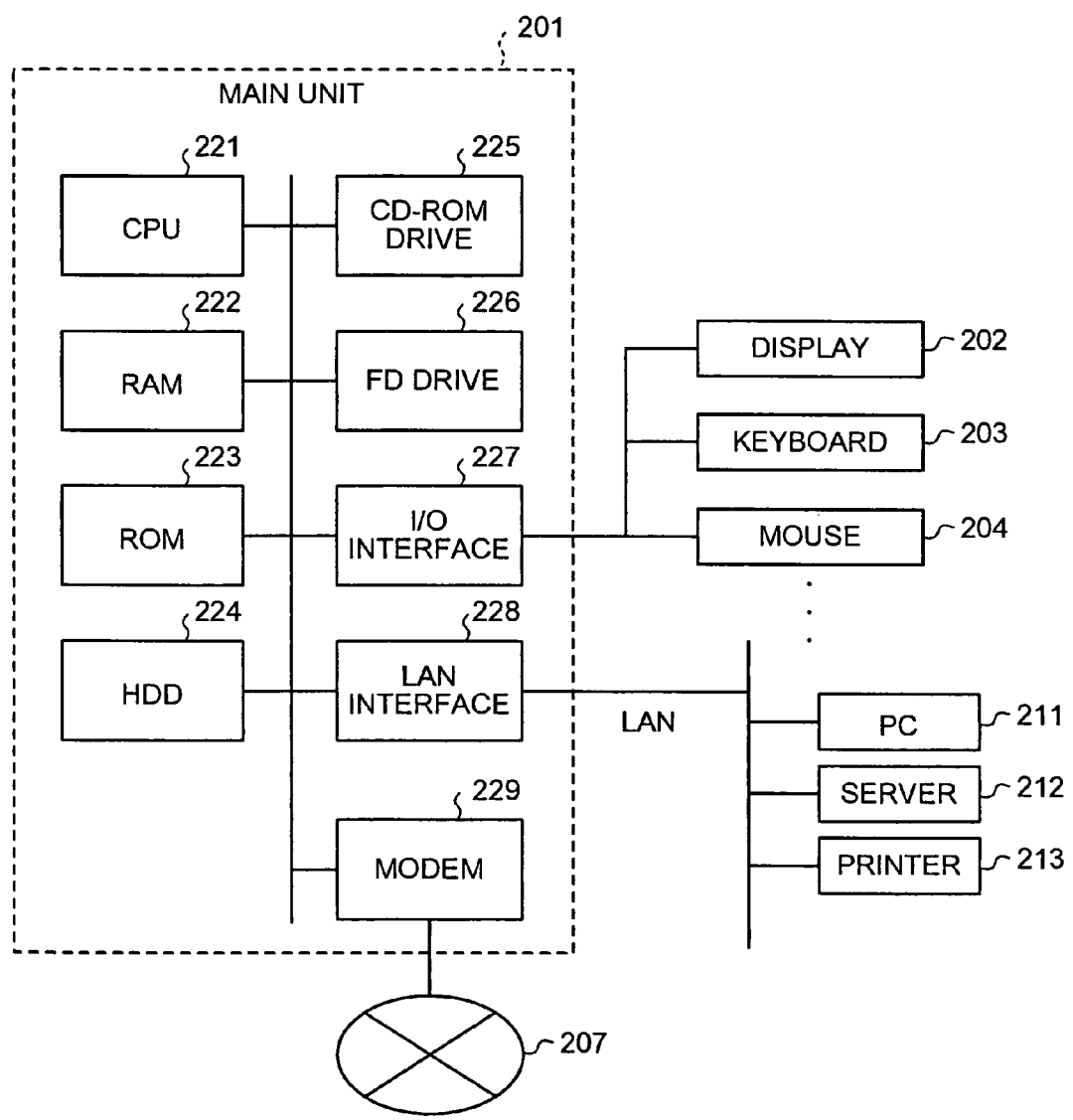
FIG. 15 is a block diagram of a structure of a main unit shown in FIG. 14.

FIG. 15 is a block diagram of a structure of a main unit shown in FIG. 14. As shown in the figure, this main unit 201 includes a central processing unit (CPU) 221, a random access memory (RAM) 222, a read only memory (ROM) 223, a hard disk drive (HDD) 224, a compact disk-read only memory (CD-ROM) drive 225, a floppy disk (FD) drive 226, an input/output (I/O) interface 227, a LAN interface 228, and a modem 229.

The wiring-capacitance calculating program executed in this computer system 200 is stored in a portable storage medium like an FD 208, a CD-ROM 209, a digital versatile disk (DVD), a magneto-optical (MO) disk, or an integrated-circuit (IC) card, read out from the storage medium, and installed in the computer system 200.

Alternatively, this wiring-capacitance calculating program is stored in a database of a server 212 connected to the computer system 200 via the LAN interface 228, a database of another computer system 211, or the like, read out from the database, and installed in the computer system 200.

Then, the installed wiring-capacitance calculating program is stored in the HDD 224 and executed by the CPU 221 using the RAM 222, the ROM 223, and the like.

According to the present invention, it is unnecessary to store wiring capacitances for combined patterns of adjacent wirings in the diagonally upward and downward directions from a target wiring in the capacitance value table. Thus, there is an effect that it is possible to reduce a size of the capacitance value table and calculate a wiring capacitance efficiently without deteriorating accuracy.

Furthermore, according to the present invention, a wiring capacitance based on an adjacent wiring in the diagonally upward direction is calculated using the capacitance value table storing a wiring capacitance for an adjacent wiring right above a target wiring. Thus, there is an effect that it is possible to make it unnecessary to store a wiring capacitance of the adjacent wiring in the diagonally upward direction from the target wiring in the capacitance value table.

Moreover, according to the present invention, a basic capacitance at the time when there is an adjacent wiring in the diagonally upward direction is calculated. Thus, there is an effect that it is possible to make it unnecessary to store a basic capacitance for a combined pattern of an adjacent wiring in the diagonally upward direction from the target wiring in the capacitance value table.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for calculating wiring capacitance of a target wiring based on adjacent wirings that are located adjacent to the target wiring, the apparatus comprising:

a first basic capacitance calculating unit that calculates first basic capacitance that is wiring capacitance between the target wiring and an adjacent wiring above the target wiring, between the target wiring and an adjacent wiring below the target wiring, between the target wiring and an adjacent wiring on a left side of the target wiring, and between the target wiring and an adjacent wiring on a right side of the target wiring;

a diagonal-capacitance calculating unit that calculates diagonal capacitance that is wiring capacitance between the target wiring and an adjacent wiring in a diagonally upward direction from the target wiring and between the target wiring and an adjacent wiring in a diagonally downward direction from the target wiring;

a second basic-capacitance calculating unit that calculates second basic capacitance based on the calculated diagonal capacitance by correcting the first basic capacitance by taking into account an influence due to the calculated diagonal capacitance; and a total-capacitance calculating unit that adds up the diagonal capacitance calculated and the second basic capacitance, to calculate the wiring capacitance, wherein the first basic capacitance and the diagonal capacitance are dependent on each other.

2. The apparatus according to claim 1, wherein the diagonal-capacitance calculating unit calculates the diagonal capacitance corresponding to the adjacent wiring in a diagonally upward direction from the target wiring by correcting the wiring capacitance between the target wiring and the adjacent wiring right above the target wiring, based on a position of the adjacent wiring in the diagonally upward direction.

3. The apparatus according to claim 2, further comprising an upward-direction capacitance value table that stores the wiring capacitance between the target wiring and the adjacent wiring right above the target wiring, wherein
the diagonal-capacitance calculating unit calculates the diagonal capacitance by acquiring the wiring capacitance corresponding to the adjacent wiring right above the target wiring from the upward-direction capacitance value table, and corrects the wiring capacitance acquired from the upward-direction capacitance value table.

4. The apparatus according to claim 1, wherein the second basic-capacitance calculating unit calculates a virtual wiring capacitance between the target wiring and the adjacent wiring in a diagonally upward direction from the target wiring that is virtually moved to a position right above the target wiring, and calculates the second basic capacitance using the calculated virtual wiring capacitance calculated.

5. The apparatus according to claim 4, wherein the virtual wiring capacitance includes
a virtual upward-direction wiring capacitance corresponding to a virtual-upward-direction adjacent wiring, which is obtained by virtually moving the adjacent wiring in the diagonally upward direction from the target wiring to the position right above the target wiring; and
a virtual basic capacitance obtained by calculating wiring capacitance corresponding to adjacent wirings below, on the left of, and on the right of the target wiring, using the virtual-upward-direction adjacent wiring.

6. The apparatus according to claim 4, further comprising:
an upward-direction capacitance value table that stores wiring capacitance between the target wiring and the adjacent wiring right above the target wiring;
a downward-direction capacitance value table that stores wiring capacitance between the target wiring and the adjacent wiring right below the target wiring; and
a left-and-right-direction capacitance value table that stores wiring capacitance between the target wiring and the adjacent wirings on the left and on the right of the target wiring, wherein
the second basic-capacitance calculating unit calculates the virtual wiring capacitance using the capacitance stored in the upward-direction capacitance value table, the downward-direction capacitance value table, and the left-and-right-direction capacitance value table.

7. The apparatus according to claim 1, further comprising a diagonally-adjacent-wiring judging unit that judges existence of the second adjacent wirings, wherein
when the diagonally-adjacent-wiring judging unit judges that there is no second adjacent wiring, the basic capacitance is used as the wiring capacitance to be calculated.

8. The apparatus according to claim 1, further comprising a diagonally-adjacent-wiring judging unit that judges an existence of the adjacent wiring in the diagonally upward or diagonally downward direction from the target wiring, wherein
when the diagonally-adjacent-wiring judging unit judges that adjacent wiring in the diagonally upward or diagonally downward direction from the target wiring exists, the second basic capacitance is calculated and added to the calculated diagonal capacitance.

9. The apparatus according to claim 1, further comprising:
a storing unit that stores the first basic capacitance calculated based on the first adjacent wirings.

10. A method of calculating wiring capacitance of a target wiring based on first adjacent wirings that are adjacent wirings above, below, on a left of, and on a right of the target wiring and are in parallel with or perpendicular to the target wiring and second adjacent wirings that are adjacent wirings in diagonally upward and downward direction from the target wiring and non-coplanar with the target wiring, the method being performed by apparatus including a first basic capacitance calculating unit, a diagonal-capacitance calculating unit, a second basic-capacitance calculating unit, and a total-capacitance calculating unit, the method comprising:
calculating, by the first basic capacitance calculating unit, first basic capacitance based on the first adjacent wirings, the first basic capacitance being wiring capacitance between the target wiring and an adjacent wiring above the target wiring, between the target wiring and an adjacent wiring below the target wiring, between the target wiring and an adjacent wiring on a left side of the target wiring, and between the target wiring and an adjacent wiring on a right side of the target wiring;
calculating, by the diagonal-capacitance calculating unit, diagonal capacitance that is wiring capacitance corresponding to the second adjacent wirings;
calculating, by the second basic-capacitance calculating unit, second basic capacitance by correcting the first basic capacitance based on the calculated diagonal capacitance by taking into account an influence due to the calculated diagonal capacitance; and
adding up, by the total-capacitance calculating unit, the diagonal capacitance calculated and the second basic capacitance, to calculate the wiring capacitance, wherein the first basic capacitance and the diagonal capacitance are dependent on each other.

11. The method according to claim 10, further comprising:
storing the first basic capacitance calculated based on the first adjacent wirings.

12. A non-transitory computer-readable recording medium that stores a computer program for calculating wiring capacitance of a target wiring based on first adjacent wirings that are adjacent wirings above, below, on a left of, and on a right of the target wiring and are in parallel with or perpendicular to the target wiring and second adjacent wirings that are adjacent wirings in diagonally upward and downward direction from the target wiring and non-coplanar with the target wiring, wherein the computer program makes a computer execute:
calculating, by the first basic capacitance calculating unit, first basic capacitance based on the first adjacent wirings, the first basic capacitance being wiring capacitance between the target wiring and an adjacent wiring above the target wiring, between the target wiring and an adjacent wiring below the target wiring, between the target wiring and an adjacent wiring on a left side of the target wiring, and between the target wiring and an adjacent wiring on a right side of the target wiring;
calculating, by the diagonal-capacitance calculating unit, diagonal capacitance that is wiring capacitance corresponding to the second adjacent wirings;
calculating, by the second basic-capacitance calculating unit, second basic capacitance by correcting the first basic capacitance based on the calculated diagonal capacitance by taking into account an influence due to the calculated diagonal capacitance; and
adding up, by the total-capacitance calculating unit, the diagonal capacitance calculated and the second basic capacitance, to calculate the wiring capacitance, wherein the first basic capacitance and the diagonal capacitance are dependent on each other.

13. The non-transitory computer-readable recording medium according to claim 12, wherein the computer program makes a computer further execute:

storing the first basic capacitance calculated based on the first adjacent wirings.

14. An apparatus for calculating wiring capacitance between a target wiring and adjacent wirings, the adjacent wirings being wirings positioned adjacent to the target wiring, the apparatus comprising:

a capacitance value table that stores basic capacitance, the basic capacitance being a capacitance between the target wiring and the adjacent wiring that is positioned directly above, between the target wiring and the adjacent wiring that is positioned directly below, and between the target wiring and the adjacent wiring that is positioned directly beside the target wiring;

a wiring data storing unit that stores data corresponding to wiring conditions;

a diagonal adjacent wiring searching unit that searches the wiring data storing unit and determines whether any diagonal adjacent wiring that is positioned in a diagonally upward or a diagonally downward direction from the target wiring exists;

a diagonal capacitance calculation unit that calculates diagonal capacitance that is a capacitance between the target wiring and the diagonal adjacent wiring by using the wiring capacitance between the target wiring and the adjacent wiring that is positioned directly above the target wiring or the wiring capacitance between the target wiring and the adjacent wiring that is positioned directly below the target wiring stored in the capacitance value table, when it is determined that diagonal adjacent wiring exists;

a basic capacitance correcting unit that corrects the basic capacitance stored in the capacitance value table based on the calculated diagonal capacitance; and a capacitance calculation unit that calculates capacitance corresponding to the target wiring based on the corrected basic capacitance and the calculated diagonal capacitance, wherein the basic capacitance and the diagonal capacitance are dependent on each other.

15. The apparatus according to claim 14, wherein the capacitance value table stores virtual capacitance that is a capacitance between the target wiring and the diagonal adjacent wiring, assuming that the diagonal adjacent wiring is virtually located directly above or directly below the target wiring, and the diagonal capacitance calculation unit calculates the diagonal capacitance by correcting the virtual capacitance stored in the capacitance value table based on the relative position between the target wiring and the diagonal adjacent wiring.

16. The apparatus according to claim 14, wherein the diagonal capacitance calculation unit calculates the diagonal capacitance based on the basic capacitance stored in the capacitance value table.

17. The apparatus according to claim 14, wherein the diagonal capacitance calculation unit calculates the diagonal capacitance by reading the adjacent capacitance between the target wiring and the adjacent wiring that is positioned directly above or directly below the target wiring from the capacitance value table, and correcting the adjacent capacitance read from the capacitance value table based on a relative position between the target wiring and the diagonally adjacent wiring.

18. A method for calculating a capacitance corresponding to a target wiring using an apparatus that includes a diagonal adjacent wiring searching unit, a diagonal capacitance calculation unit, a basic capacitance correcting unit, and a capacitance calculation unit, the method comprising:

obtaining basic capacitance, from a capacitance value table, the basic capacitance being a capacitance between the target wiring and adjacent wirings, the adjacent wirings being wirings that are positioned directly above, directly below, or directly beside the target wiring;

determining, by the diagonal adjacent wiring searching unit, whether any diagonal adjacent wiring that is positioned in a diagonally upward or a diagonally downward direction from the target wiring exists;

calculating, by the diagonal capacitance calculation unit, diagonal capacitance that is a capacitance between the target wiring and the diagonal adjacent wiring when it is determined that diagonal adjacent wiring exists;

correcting, by the basic capacitance correcting unit, the basic capacitance by taking into account an influence due to the calculated diagonal capacitance; and calculating, by the capacitance calculation unit, capacitance corresponding to the target wiring by adding the corrected basic capacitance and the calculated diagonal capacitance, wherein the basic capacitance and the diagonal capacitance are dependent on each other.

19. The method according to claim 18, further comprising:

obtaining a virtual diagonal capacitance that is a capacitance between the target wiring and the diagonal adjacent wiring that is assumed to be located directly above or directly below the target wiring, wherein the diagonal capacitance is calculated by correcting the virtual diagonal capacitance based on a relative position between the target wiring and the determined diagonal adjacent wiring.

* * * * *